United States Patent [19]
Kohno et al.

[11] Patent Number: 5,412,321
[45] Date of Patent: May 2, 1995

[54] MAGNETIC RESONANCE IMAGING METHOD AND APPARATUS

[75] Inventors: Satoru Kohno; Naoto Iijima, both of Kyoto, Japan

[73] Assignee: Shimadzu Corporation, Kyoto, Japan

[21] Appl. No.: 158,269

[22] Filed: Nov. 29, 1993

[30] Foreign Application Priority Data

Nov. 30, 1992 [JP] Japan ................................ 4-345528

[51] Int. Cl.$^6$ ........................................... G01R 33/20
[52] U.S. Cl. ..................................... 324/309; 324/300
[58] Field of Search ............... 324/318, 307, 309, 301; 128/653.2

[56] References Cited

U.S. PATENT DOCUMENTS

| | | | |
|---|---|---|---|
| 4,706,028 | 11/1987 | Yoda et al. | 324/309 |
| 4,714,884 | 12/1987 | Glover | 324/309 |
| 4,893,081 | 1/1990 | Zur | 324/309 |
| 5,068,609 | 11/1991 | Bruder et al. | 324/309 |
| 5,109,197 | 4/1992 | Onodera et al. | 324/309 |
| 5,270,654 | 12/1993 | Feinberg et al. | 324/309 |

FOREIGN PATENT DOCUMENTS

| | | |
|---|---|---|
| 0515197A1 | 11/1992 | European Pat. Off. . |
| 0529527A1 | 3/1993 | European Pat. Off. . |
| 0577188A1 | 1/1994 | European Pat. Off. . |

OTHER PUBLICATIONS

"Partial RF Echo Planar Imaging with the FAISE Method. I. Experimental and Theoretical Assessment of Artifact"; Magnetic Resonance in Medicine 26, pp. 328–341 (1992).

"A Phase–Cycling Technique for Canceling Spurious Echoes in NMR Imaging"; Journal of Magnetic Resonance 71, pp. 212–228 (1987).

*Primary Examiner*—Sandra L. O'Shea
*Assistant Examiner*—Raymond Y. Mah
*Attorney, Agent, or Firm*—Nikaido, Marmelstein, Murray & Oram

[57] ABSTRACT

A magnetic resonance imaging method for emitting a single excitation RF pulse and then a plurality of refocusing RF pulses to an examinee to generate echo signals successively. This method includes the steps of emitting the single excitation RF pulse and then the plurality of refocusing RF pulses to the examinee to generate echo signals successively; applying slice selecting gradient field pulses for selecting a slice plane simultaneously with the excitation RF pulse and the refocusing RF pulses; applying phase encoding gradient field pulses for phase-encoding a key echo signal and subsequent echo signals among the echo signals resulting from the above steps, without applying the phase encoding gradient field pulses for phase-encoding echo signals generated before the key echo signal, the key echo signal being a signal having collected data of lines in and adjacent a center region of a raw data space of the slice plane; and applying reading gradient field pulses in respect of the echo signals for which the phase encoding gradient field pulses have been applied.

6 Claims, 2 Drawing Sheets

MAGNETIC RESONANCE IMAGING METHOD AND APPARATUS

BACKGROUND OF THE INVENTION (1) Field of the Invention

This invention relates to a magnetic resonance imaging method and apparatus utilizing NMR (nuclear magnetic resonance), and more particularly to a magnetic resonance imaging method and apparatus for obtaining images by the fast spin echo method.

(2) Description of the Related Art

Conventional magnetic resonance imaging methods include a fast spin echo method using pulse trains called RARE (Rapid Acquisition with Relaxation Enhancement). In the fast spin echo method based on RARE, a single excitation RF (Radio Frequency) pulse (also called a 90° pulse since the spin phases of protons are rotated 90°) and then a plurality of refocusing RF pulses (also called 180° pulses since the spin phases of protons are rotated 180°) are emitted to an examinee to generate echo signals (primary echoes) successively. These echo signals are subjected to different phase encoding to obtain data of a plurality of lines in a raw data space at a time. In this way, the excitation RF pulse emission is repeated a reduced number of times to expedite image pickup.

A frequency profile produced by the refocusing RF pulses, ideally, is in a square wave. In practice, however, this is an imperfect square wave having rounded edges. Because of this imperfection, there always occur some magnetization vectors having tilt angles only at 90°, and not 180°, due to the spins of protons in the examinee's body. As a result, spurious echo signals are inevitable. In the conventional multiecho method, these spurious echo signals cause various artifacts such as a mirror artifact with a mirror-reversed image due to the spurious echo signals superimposed on a normal image due to proper echo signals. A proposal has been made heretofore to control the phases of RF pulses for canceling the spurious echo signals, thereby to eliminate the influences of the spurious echo signals (Y. Zur et al; Journal of Magnetic Resonance 71, 212–228, 1987).

However, spurious echo signals contain information for visualizing images. Image contrast could be enhanced by utilizing such information. Canceling the spurious echo signals as in the prior art results in poor signal utilization efficiency.

In the RARE method, a CPMG pulse train (Carr-Purcell-Gill-Meiboom Impulse Folge) is formed. When this pulse train occurs, the period and strength of application to gradient fields are adjusted so that rephasing conditions are satisfied for all the gradient fields. Thus, the spurious echo signals and proper echo signals are brought into phase, whereby the spurious echo signals as well as the proper echo signals are utilized to visualize images (Japanese Patent Publication (Unexamined) No. 61-77748).

However, a gradient field coil disposed inside a main magnet which forms a static magnetic field, owing to eddy currents or the like caused by leakage from the gradient fields, disturbs the static field which is otherwise maintained uniform by the main magnet. This gives rise to the problem of obstructing spurious echo signals and proper echo signals coming into phase. In order to solve this problem, a special, shielded gradient field coil is required for preventing leakage of the fields to avoid disturbance of the static field formed by the main magnet.

SUMMARY OF THE INVENTION

The present invention has been made having regard to the state of the art noted above. The object of the invention, therefore, is to provide a magnetic resonance imaging method and apparatus which allow spurious echo signals as well to be utilized effectively for image visualization, without requiring a special gradient field coil such as a shielded coil, thereby to obtain a high contrast image.

The above object is fulfilled, according to one aspect of the present invention, by a magnetic resonance imaging method for emitting a single excitation RF pulse and then a plurality of refocusing RF pulses to an examinee to generate echo signals successively, the method comprising the steps of:

(a) emitting the single excitation RF pulse and then the plurality of refocusing RF pulses to the examinee to generate echo signals successively;

(b) applying slice selecting gradient field pulses for selecting a slice plane simultaneously with the excitation RF pulse and the refocusing RF pulses;

(c) applying phase encoding gradient field pulses for phase-encoding a key echo signal and subsequent echo signals among the echo signals resulting from steps (a) and (b) above, without applying the phase encoding gradient field pulses for phase-encoding echo signals generated before the key echo signal, the key echo signal being a signal having collected data of lines in and adjacent a center region of a raw data space of the slice plane; and (d) applying reading gradient field pulses in respect of the echo signals for which the phase encoding gradient field pulses have been applied.

A single excitation RF pulse and then a plurality of refocusing RF pulses are emitted to the examinee, and echo signals successively generated are subjected to phase encoding. No phase encoding gradient field pulses are applied to echo signals generated before the key echo signal having collected data of lines in and adjacent the center region of a raw data space of the slice plane. Consequently, phase shifts due to the eddy currents and the like caused by the gradient field pulses are minimized for positions in and adjacent the center region of the raw data space which would significantly affect a reconstructed image. The echo signals generated after the key echo signal involve phase shifts due to the eddy currents and the like caused by the gradient field pulses. However, the data collected from these echo signals correspond to peripheral regions of the raw data space, and exert little influence on the reconstructed image. Proper echo signals and spurious echo signals may, therefore, be brought substantially into phase without requiring a special gradient field coil such as a shielded coil. As a result, the spurious echo signals besides the proper echo signals may be utilized effectively for image visualization to enhance contrast of the reconstructed image.

Preferably, at step (a) of the method according to this invention, an "n"th refocusing RF pulse ("n" being a positive integer) is emitted at a point of time after emission of the excitation RF pulse, expressed by $\{2(n-1)+1\}\tau$, where $\tau$ is a point of time at which a first excitation RF pulse is emitted.

By emitting the refocusing RF pulses with the above timing, each echo signal may be generated upon lapse of time corresponding to the time taken before generation of the first echo signal multiplied by an integer. Consequently, the spurious echo signals due to the imperfection of the refocusing RF pulses are generated at the same moments in time as the proper echo signals, to minimize phase shift, whereby the spurious echo signals may also be utilized for image visualization.

In the method according to this invention, the key echo signal at step (c) may be an echo signal occurring upon lapse of 60 to 120 msec after emission of the excitation RF pulse.

That is, an echo signal is generated from adjacent the center of the slice plane in the examinee 60 to 120 msec from the time of emission of the excitation RF pulse. This signal, when adopted as the key echo signal, results in an image of high contrast.

Preferably, in the method according to this invention, the key echo signal and subsequent echo signals are phase-encoded at step (c) such that the greater phase encoding is effected for the later echo signal.

The later the echo signal trails the key echo signal, the greater phase shift is caused by the eddy currents due to the gradient field pulses. However, since the echo signals generated later correspond to peripheral regions of the raw data space in the slice plane, a reconstructed image is little affected.

In the method according to this invention, step (c) may include a step of applying rewind pulses having the same strength and pulsewidth as and a polarity reversed from the phase encoding gradient field pulses, the rewind pulses being applied symmetrically to the phase encoding gradient field pulses about centers of the key echo signal and subsequent echo signals.

The rewind pulses having the same strength and pulsewidth as and a polarity reversed from the phase encoding gradient field pulses are applied across the centers of the echo signals. This allows the respective echo signals to have the same initial state to enable only separate and independent phase encoding without influences of other, immediately preceding phase encoding. As a result, phase shifts are checked to minimize their influence on the reconstructed image.

In a further aspect of this invention, there is provided a magnetic resonance imaging apparatus having a main magnet for generating a uniform static magnetic field in a photographic space in which an examinee is placed, a gradient field coil for generating three types of gradient field pulses (slice selecting gradient field pulses, phase encoding gradient field pulses, and reading gradient field pulses) having field strengths varying in three-dimensional directions perpendicular to one another in the static magnetic field, and an RF coil for emitting an excitation RF pulse to the examinee and detecting echo signals from the examinee, the apparatus comprising:

an RF pulse emitting device for emitting a single excitation RF pulse and then a plurality of refocusing RF pulses successively with predetermined timing through the RF coil, an "n"th refocusing RF pulse ("n" being a positive integer) being emitted at a point of time after emission of the excitation RF pulse, expressed by $\{2(n-1)+1\}\tau$, where $\tau$ is a point of time at which a first excitation RF pulse is emitted;

a slice selecting gradient field pulse generating device for generating gradient field pulses through the gradient field coil to select a slice plane, in synchronism with emission of the excitation RF pulse and the refocusing RF pulses;

a phase encoding gradient field pulse generating device for generating phase encoding gradient field pulses through the gradient field coil synchronously with a key echo signal and subsequent echo signals, without generating the phase encoding gradient field pulses before generation of the key echo signal, the key echo signal being a signal having collected data of lines in and adjacent a center region of a raw data space of the slice plane, the phase encoding gradient field pulses effecting the greater phase encoding for the later echo signal; and a reading gradient field pulse generating device for generating reading gradient field pulses through the gradient field coil synchronously with the echo signals.

The RF pulse generating device causes each echo signal to be generated upon lapse of time corresponding to the time taken before generation of the first echo signal multiplied by an integer. Thus, the spurious echo signals due to the imperfection of the refocusing RF pulses are generated at the same moments in time as the proper echo signals, to minimize phase shift, whereby the spurious echo signals may also be utilized for image visualization. As a result, the spurious echo signals besides the proper echo signals may be utilized effectively for image visualization to enhance contrast of a reconstructed image.

Further, the slice selecting gradient field pulse generating device selects and excites a slice plane simultaneously with each of the RF pulses. The phase encoding gradient field pulse generating device applies no phase encoding gradient field pulses to the echo signals generated before the key echo signal having collected data of lines in and adjacent the center region of a raw data space of the slice plane. Consequently, phase shifts due to the eddy currents and the like caused by the gradient field pulses are minimized for positions adjacent the center of the raw data space which would significantly affect a reconstructed image. Regarding the key echo signal and subsequent echo signals, the greater phase encoding is effected for the later echo signal. Consequently, the later the echo signal trails the key echo signal, the greater phase shift is caused by the eddy currents due to the gradient field pulses. However, since the echo signals generated later correspond to peripheral regions of the raw data space in the slice plane, the reconstructed image is little affected. The reading gradient field pulse generating device applies reading pulses to read the signals. As a result, the spurious echo signals may also be utilized for image visualization without requiring a special gradient field coil such as a shielded coil for checking the phase shifts due to eddy currents and the like.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

DETAILED DESCRIPTION OF THE PREFERRED EMBODIMENT

A preferred embodiment of this invention will be described in detail hereinafter with reference to the drawings.

Figure 1:
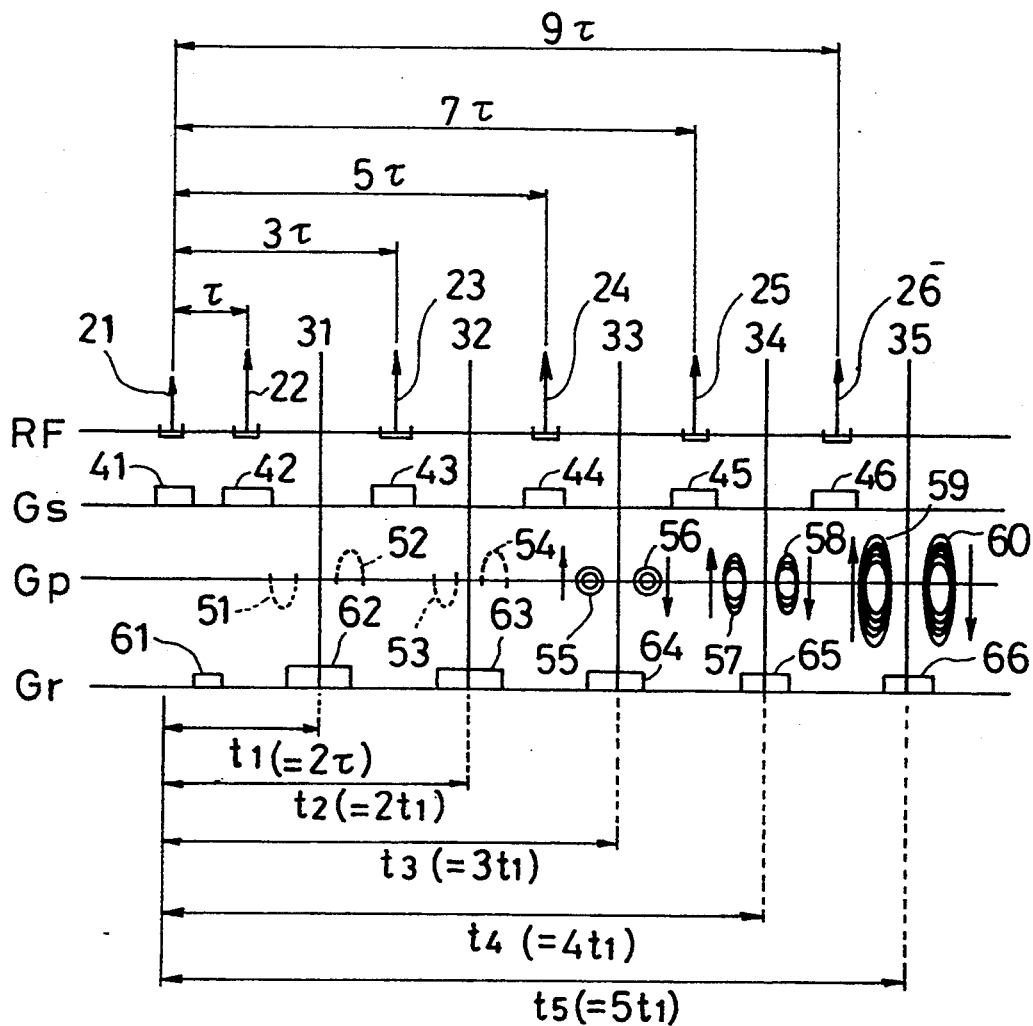
FIG. 1 is a time chart showing a pulse sequence in one embodiment of this invention.
Figure 3:
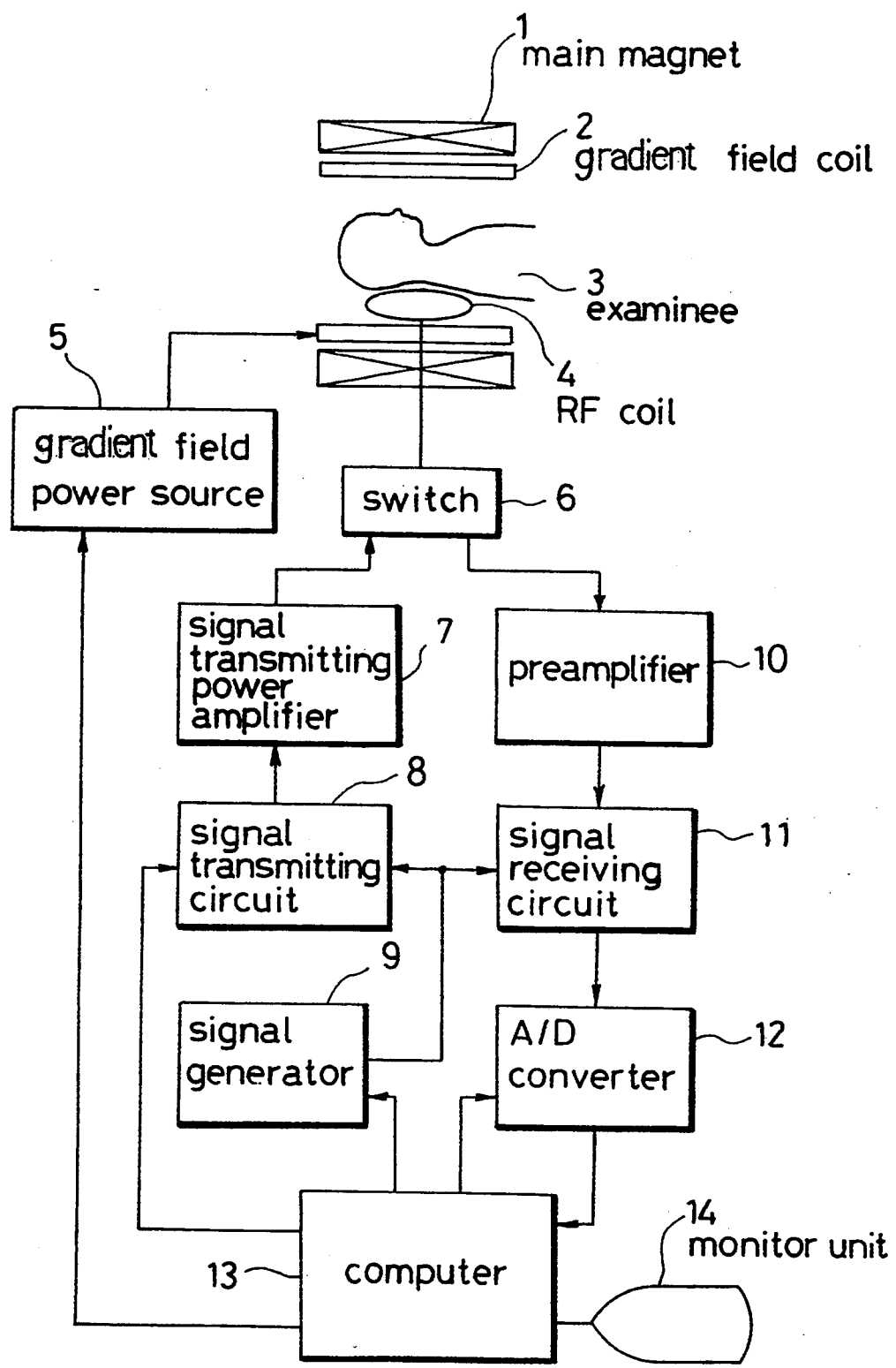
FIG. 3 is a block diagram of a nuclear magnetic resonance imaging apparatus in this embodiment.

In one embodiment of this invention, a pulse sequence as shown in FIG. 1 is performed by an apparatus as shown in FIG. 3. A construction of the apparatus will be described first with reference to FIG. 3.

Numeral 1 denotes an annular main magnet formed of a hollow magnet such as a superconductive magnet, for generating a time-stable, uniform static magnetic field in a photographic region. A gradient field coil 2 is disposed inside the main magnet 1 for generating gradient magnetic fields. The gradient field coil 2 includes three gradient field coil units for superimposing, on the uniform static magnetic field generated by the main magnet 1, three types of gradient field pulses having field strengths varying in three-dimensional directions perpendicular to one another (i.e. slice selecting gradient field pulses, phase encoding gradient field pulses, and reading gradient field pulses). The gradient magnetic fields generated by the gradient field coil 2 have directions of magnetic force corresponding to those of the static magnetic field generated by the main magnet 1, and have different strengths in different spatial positions.

An examinee 3 is placed in a space (photographic region) surrounded by the gradient field coil 2 inside the main magnet 1, where the static magnetic field and gradient magnetic fields are formed. An RF coil 4 is disposed adjacent a site of the examinee 3 to be examined, for emitting an excitation RF pulse and refocusing RF pulses to the examinee 3 and receiving NMR signals (echo signals) generated by the examinee 3. In this embodiment, the RF coil 4 is used both for emitting the RF pulses and for receiving the NMR signals, but separate RF coils may be provided for the respective functions.

A gradient field power source 5 is connected to the gradient field coil 2 for supplying gradient field generating power thereto. A signal transmitting power amplifier 7 and a preamplifier 10 are connected to the RF coil 4 through a switch 6. The switch 6 is operable to select the signal transmitting power amplifier 7 in time of excitation, and the preamplifier 10 in time of signal reception. The signal transmitting power amplifier 7 receives RF signals from a signal transmitting circuit 8. The signal transmitting circuit 8 receives carrier signals from a signal generator 9, and modulates these signals with a modulator signal having a predetermined waveform into the RF signals. A signal receiving circuit 11 is connected to the preamplifier 10 for phase detection of the signals received, using the signals from the signal generator 9 as reference signs. The signals detected are sampled and converted to digital data by an analog-to-digital converter 12, which are inputted to a computer 13. A signal transmitting line including the RF coil 4, signal transmitting power amplifier 7 and the like, and computer 13 for controlling these components corresponds to an RF pulse generating device of this invention. The gradient field coil 2 and gradient field power source 5, together with the computer 13 for controlling these correspond to a slice selecting gradient field pulse generating device, a phase encoding gradient field pulse generating device, and a reading gradient field pulse generating device of this invention.

The computer 13 controls the waveform of the modulating signal for producing the excitation RF pulse at the signal transmitting circuit 8, determines a frequency for the signal generator 9, and determines sampling timing for the analog-to-digital converter 12. Further, the computer 13 controls the gradient field power source 5, and programs selected timing, waveforms, strengths and the like of the pulses for forming three gradient fields (i.e. a slice selecting gradient field Gs, a phase encoding gradient field Gp, and a reading gradient field Gr) having field strengths varying in the three-dimensional directions perpendicular to one another. The computer 13 also carries out processes to reconstruct images from the digital data collected. A monitor unit 14 displays the reconstructed images and other information.

The magnetic resonance imaging apparatus having the above construction performs the pulse sequence shown in FIG. 1, under control of the computer 13. In the pulse sequence shown in FIG. 1, the signal transmitting power amplifier 7 applies an excitation RF pulse 21 to the RF coil 4 through the switch 6. At the same time, the gradient field power source 5 applies a pulse 41 for the slice selecting gradient field Gs in a predetermined direction in order to obtain a desired slice plane. Thereafter the signal transmitting power amplifier 7 successively applies, to the RF coil 4 through the switch 6, refocusing RF pulses 22, 23, 24, 25 and 26 synchronized with pulses 42, 43, 44, 45 and 46 for the slice selecting gradient field Gs, in order to generate echo signals.

In this case, a first echo signal occurs around a point of time 31 ($2\tau$) trailing the refocusing RF pulse 22 by a period of time corresponding to a period of time ($\tau$) between the excitation RF pulse 21 and refocusing RF pulse 22. Here, the time (echo delay time $2\tau$) taken from the excitation RF pulse 21 to the echo center 31 is termed time t1.

Assuming that the echo delay time from the excitation RF pulse 21 to the echo center 31 is termed t1 as above, the first refocusing RF pulse 22 takes place at a point of time $t=(1/2)t1=\tau$, where the point of time for the excitation RF pulse 21 is regarded as the origin of time (t=0). The emission timing for an "n"th refocusing RF pulse ("n" being a positive integer) is derived from $\{2(n-1)+1\}\tau$. Thus, the refocusing RF pulses 23, 24, 25 and 26 are emitted at points of time $t=(3/2)t1=3\tau$, $(5/2)t1=5\tau$, $(7/2)t1=7\tau$, and $(9/2)t1=9\tau$, respectively, whereby echo signals are generated at points of time t=t2, t3, t4 and t5. Consequently, the periods of time t2, t3, t4 and t5 from the excitation RF pulse 21 to the second and subsequent echo signals are derived from the period of time t1 from the excitation RF pulse to the first echo signal multiplied by integers, that is t2=2t1, t3=3t1, t4=4t1 and t5=5t1. Specific examples of these time periods are t1=20 ms, and thus t2=40ms, t3=60 ms, t4=80 ms and t5=100 ms.

To turn raw data space information on the slice plane of the examinee 3 into echo signal phase information, the gradient field power source 5 applies the phase encoding gradient field Gp immediately before the reading gradient field Gr. Pulses 51, 52, 53 and 54 for the phase encoding gradient field Gp corresponding to the first and second echo signals are not applied, and furthermore data of these echo signals are not collected. Pulses 55, 57 and 59 for the phase encoding gradient field Gp and pulses 64, 65 and 66 for the reading gradient field Gr are applied, which correspond only to the echo signals occurring around echo centers 33, 34 and 35. Data are collected in respect of the third echo signal (key echo signal) and subsequent echo signals. It is to be noted that pulses 56, 58 and 60 for the phase encoding gradient field Gp are rewind pulses having an opposite working direction to phase encoding based on pulses 55, 57 and 59 for the gradient field Gp. These rewind pulses have the same strength and pulsewidth as and a polarity reversed from pulses 55, 57 and 59 for the gradient field Gp, and are applied symmetrically thereto about the centers of the respective echo signals. As a result, the respective echo signals have the same initial state to enable only separate and independent phase encoding without influences of other, immediately preceding phase encoding, thereby to minimize phase shift.

Figure 2:
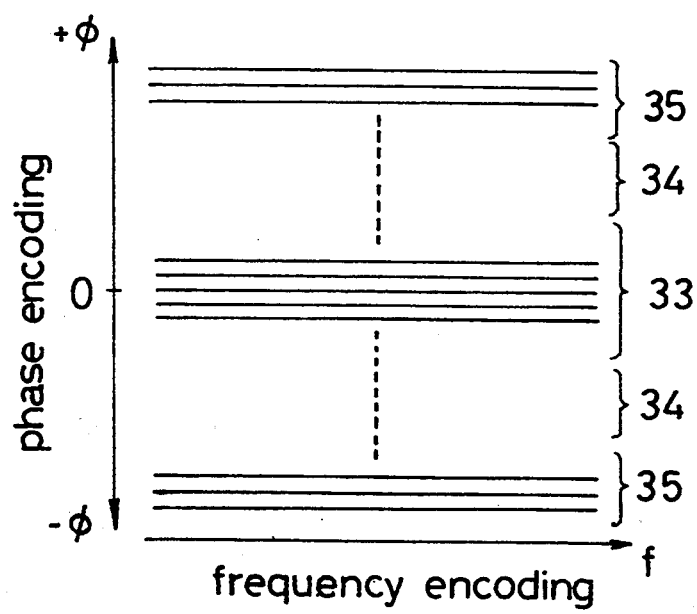
FIG. 2 is a view showing a raw data space in this embodiment.

As shown in FIG. 2, the phase encoding for the third and subsequent echo signals has the greater extent for the later echo signal. Consequently, data of lines disposed in and adjacent a center area in the phase encoding direction of the raw data space are collected from the key echo signal occurring around the echo center 33. Data collected from the echo signal occurring around the echo center 34 is regarded as data of lines displaced from the center of the raw data space. Data of lines in most peripheral positions of the raw data space are collected from the echo signal occurring around the echo center 35.

Data are collected from the third and subsequent echo signals for the following reason. The contrast of a reconstructed image has a property that it is governed by the echo signal collecting data from adjacent the center of the raw data space (in this specification, this echo signal is called the key echo signal to distinguish from other echo signals). Further, to obtain a clinically useful contrast called T2 (transverse relaxation time) enhanced contrast from the examinee, it is usually desirable that the key echo signal collecting data from adjacent the center of the raw data space takes place in the order of 60 to 120 ms from the excitation RF pulse 21. Since the echo time t1 is set to about 20 ms here, the echo signal occurring upon laps of at least three times the echo time (60 ms) from application of the excitation RF pulse 21 is adopted as the key echo signal to obtain T2 enhanced contrast. The fourth or subsequent echo signal occurring about 80 ms from the excitation RF pulse 21 or later may be adopted as the key echo signal as long as this signal occurs within the above time range.

Since the periods of time t2, t3, t4 and t5 are products of the period of time t1 and integers, spurious echo signals due to the imperfection of refocusing RF pulses 22, 23 and so on for generating the echo signals also occur around the echo centers 32, 33 and so on, overlapping proper echo signals in time. Thus, the spurious echo signals and proper echo signals are generated at the same moments in time to overlap each other, with a minimum phase shift. Any remaining phase shifts are caused primarily by variations in the eddy currents due to the pulses for the phase encoding gradient field Gp applied earlier. However, as noted hereinbefore, pulses for the phase encoding gradient field Gp are not applied in relation to the first and second echo signals which are not used in the data collection. This ensures that the proper echo signal and spurious echo signal occurring around the echo center 33 are not affected by phase shifts due to eddy currents.

In the case of echo center 34 and subsequent echo centers, pulses 55, 56 and so on for the phase encoding gradient field Gp are applied beforehand. In addition, such pulses for the gradient field Gp become progressively greater. As a result, the later the pulse for the gradient field Gp is, the greater phase shift is caused by the eddy currents. The data collected from the echo signal occurring around the echo center 33 is that of a location adjacent the center of the raw data space. The data collected from the echo signals occurring around echo center 34 and subsequent echo centers are such that the later the echo signals occur, the farther away the locations to which the data pertain are from the center of the raw data space. The closer the data is to the center of the raw data space, the more seriously the above phase shift affects a reconstructed image. The same phase shift would affect the image less in a peripheral region than in a central region.

Thus, spurious echo signals besides proper echo signals may be utilized as signals for image visualization while minimizing the influences of phase shift on the reconstructed image. Such effective use of the signals realizes a reconstructed image of high contrast.

In the embodiment described above, a single excitation RF pulse is used to allow generation of five echo signals, and data are collected from the third and subsequent echo signals. This invention is not limited to such a numerical relationship, but various other numbers may be employed within the purport of this invention.

The present invention may be embodied in other specific forms without departing from the spirit or essential attributes thereof and, accordingly, reference should be made to the appended claims, rather than to the foregoing specification, as indicating the scope of the invention.

What is claimed is:

1. A magnetic resonance imaging method for emitting a single excitation RF pulse and then a plurality of refocusing RF pulses to an examinee to generate echo signals successively, said method comprising the steps of:
   (a) emitting said single excitation RF pulse and then said plurality of refocusing RF pulses to the examinee to generate echo signals successively;
   (b) applying slice selecting gradient field pulses for selecting a slice plane simultaneously with said excitation RF pulse and said refocusing RF pulses;
   (c) applying phase encoding gradient field pulses for phase-encoding a key echo signal and subsequent echo signals among the echo signals resulting from steps (a) and (b) above, without applying the phase encoding gradient field pulses for phase-encoding echo signals generated before said key echo signal, said key echo signal being a signal having collected data of lines in and adjacent a center region of a raw data space of said slice plane; and
   (d) applying reading gradient field pulses in respect of the echo signals for which said phase encoding gradient field pulses have been applied.

2. A method as defined in claim 1, wherein, at step (a), an "n"th refocusing RF pulse, "n" being a positive integer is emitted at a point of time after emission of said excitation RF pulse, expressed by $\{2(n-1)+1\}\tau$, where $\tau$ is a point of time at which a first excitation RF pulse is emitted.

3. A method as defined in claim 1, wherein said key echo signal at step (c) is an echo signal occurring upon lapse of 60 to 120 msec after emission of said excitation RF pulse.

4. A method as defined in claim 1, wherein said key echo signal and subsequent echo signals are phase-encoded at step (c) such that the greater phase encoding is effected for the later echo signal.

5. A method as defined in claim 1, wherein step (c) includes a step of applying rewind pulses having the same strength and pulsewidth as and a polarity reversed from said phase encoding gradient field pulses, said rewind pulses being applied symmetrically to said phase encoding gradient field pulses about centers of said key echo signal and subsequent echo signals.

6. A magnetic resonance imaging apparatus having a main magnet for generating a uniform static magnetic field in a photographic space in which an examinee is placed, a gradient field coil for generating slice selecting gradient field pulses, phase encoding gradient field pulses, and reading gradient field pulses having field strengths varying in three-dimensional directions perpendicular to one another in the static magnetic field, and an RF coil for emitting an excitation RF pulse to the examinee and detecting echo signals from the examinee, said apparatus comprising:

RF pulse emitting means for emitting a single excitation RF pulse and then a plurality of refocusing RF pulses successively with predetermined timing through said RF coil, an "n"th refocusing RF pulse ("n" being a positive integer) being emitted at a point of time after emission of said excitation RF pulse, expressed by $\{2(n-1)+1\}\tau$, where $\tau$ is a point of time at which a first excitation RF pulse is emitted;

slice selecting gradient field pulse generating means for generating gradient field pulses through said gradient field coil to select a slice plane, in synchronism with emission of said excitation RF pulse and said refocusing RF pulses;

phase encoding gradient field pulse generating means for generating phase encoding gradient field pulses through said gradient field coil synchronously with a key echo signal and subsequent echo signals, without generating the phase encoding gradient field pulses before generation of said key echo signal, said key echo signal being a signal having collected data of lines in and adjacent a center region of a raw data space of said slice plane, said phase encoding gradient field pulses effecting the greater phase encoding for the later echo signal; and reading gradient field pulse generating means for generating reading gradient field pulses through said gradient field coil synchronously with said echo signals.

* * * * *